US012736564B2

(12) United States Patent
Ju et al.

(10) Patent No.: US 12,736,564 B2
(45) Date of Patent: Sep. 15, 2026

(54) INTEGRATED OPTICAL SYSTEM-BASED OPTICAL CURRENT SENSOR SYSTEM

(71) Applicant: OPTONICS CO., LTD., Gwangju (KR)

(72) Inventors: Seong-Min Ju, Gwangju (KR); Young-Woo Lee, Gwangju (KR)

(73) Assignee: OPTONICS CO., LTD., Gwangju (KR)

( * ) Notice: Subject to any disclaimer, the term of this patent is extended or adjusted under 35 U.S.C. 154(b) by 169 days.

(21) Appl. No.: 18/711,557

(22) PCT Filed: Nov. 21, 2022

(86) PCT No.: PCT/KR2022/018412
§ 371 (c)(1),
(2) Date: May 17, 2024

(87) PCT Pub. No.: WO2023/106687
PCT Pub. Date: Jun. 15, 2023

(65) Prior Publication Data
US 2025/0012832 A1 Jan. 9, 2025

(30) Foreign Application Priority Data
Dec. 8, 2021 (KR) ........................ 10-2021-0175106

(51) Int. Cl.
*G01R 15/24* (2006.01)
*G01R 19/00* (2006.01)

(52) U.S. Cl.
CPC ....... *G01R 15/246* (2013.01); *G01R 19/0092* (2013.01)

(58) Field of Classification Search
CPC .. G01R 15/246; G01R 19/0092; G01R 15/22; G01R 15/24; G01R 15/247; G02B 5/30; G02B 6/024; G02B 5/3025; G02B 5/3083
See application file for complete search history.

(56) References Cited

U.S. PATENT DOCUMENTS 6,259,831 B1 7/2001 Faris et al.
2005/0083033 A1* 4/2005 Kurosawa ............ G01R 15/246 324/96

(Continued)

FOREIGN PATENT DOCUMENTS

KR 20110081444 A 7/2011
KR 20160118314 A 10/2016

(Continued)

OTHER PUBLICATIONS

International Search Report - PCT/KR2022/018412 dated Feb. 27, 2023.

*Primary Examiner* — Feba Pothen

(74) *Attorney, Agent, or Firm* — CANTOR COLBURN LLP

(57) ABSTRACT

Provided is an integrated optical system-based optical current sensor system comprising a light source generating reference light for current or magnetic field sensing, a polarizer for polarizing the reference light, a phase modulator for phase-modulating the polarized light into a predetermined reference signal, and a Faraday rotation reflector for reflecting the light propagated through an optical path at the end of the optical fiber, wherein the invention further comprises a plurality of pig-tailed optical fiber blocks in which the optical fibers are accommodated therein, and an integrated optical system composed of a plurality of optical components optically bonded to the pig-tailed blocks at interfaces with the pig-tailed blocks.

3 Claims, 4 Drawing Sheets

(56) References Cited

U.S. PATENT DOCUMENTS

| | | | | |
|---|---|---|---|---|
| 2013/0093410 | A1* | 4/2013 | Eriksson | G01R 15/242<br>324/96 |
| 2015/0345950 | A1 | 12/2015 | Yao | |
| 2016/0377660 | A1* | 12/2016 | Müller | G01R 19/32<br>324/96 |

FOREIGN PATENT DOCUMENTS

| | | | |
|---|---|---|---|
| KR | 20170141150 | A | 12/2017 |
| KR | 102231195 | B1 | 3/2021 |

* cited by examiner

INTEGRATED OPTICAL SYSTEM-BASED OPTICAL CURRENT SENSOR SYSTEM

TECHNICAL FIELD OF INVENTION

The present invention relates to a current sensor, and more particularly to an optical current sensor system based on an integrated optical system.

BACKGROUND INFORMATION AND PRIOR ART

Generally, current transformers (CTs), which have been widely used for current measurement, involves winding a wire around a ferromagnetic core to induce a secondary current in the secondary winding due to the magnetic field generated by the current flowing through the primary winding, and measuring the magnitude of the primary current.

When using this method to measure high currents, accuracy may be compromised due to leakage currents or magnetic saturation. Additionally, electromagnetic current transformers, which detect a magnetic field proportional to the current by utilizing the Hall effect, have also been widely used. However, these electromagnetic current transformers suffer from the problem of accuracy reduction due to the influence of surrounding magnetic fields, and lack the response speed necessary to detect rapidly changing currents.

Furthermore, conventional electromagnetic field type current sensors also have narrow measurement ranges, limitations on current capacity, and significant environmental dependence on external magnetic fields and high currents. Additionally, the electromagnetic field type current sensors have narrow application current ranges, resulting in low practicality, and require thermal stability due to heat generation from high-frequency oscillations.

Recently, optical fiber current sensor technology has gained attention to address the drawbacks of the electromagnetic field type current sensors. Particularly, current sensor systems based on polarization-rotated reflection interferometry are receiving particular attention from the perspective of system stability.

Optical fiber-based current sensors wrap optical fibers around conductors through which current flows, aligning the optical fibers with the direction of the magnetic field and detecting current using the Faraday effect. This method overcomes limitations regarding the current capacity of measurement targets and long-distance transmission, exhibiting excellent precision.

Furthermore, optical fiber current sensors can overcome the drawbacks of traditional electronic current sensors such as hunting phenomenon (where the amount to be suppressed and the action of the suppression device repeatedly increase and decrease, leading to an unstable state) and limitations on measurement range and current capacity. In particular, optical fiber current sensors have the advantages of fast response characteristics and low power consumption.

FIG. 1 shows a schematic diagram of a current sensor system based on polarization-rotated reflection interferometry, composed of a light source, a sensing unit, and a polarization analysis unit. Referring to FIG. 1, a typical optical current sensor system based on polarization-rotated reflection interferometry, comprises a light source, a sensing unit, and a polarization analysis unit.

Specifically, the input light from a light source is converted into linearly polarized light by a polarizer and a polarization controller. This linearly polarized light is then incident on a polarization-maintaining fiber (PMF) at a 45° angle, causing it to be polarized in the fast and slow axis directions of the PMF, with each progressing light having the same magnitude. This light is then converted into left circularly polarized light and right circularly polarized light by a quarter-wave plate (QWP) connected directly in front of a coil, and proceeds along the optical fiber sensor coil. At that time, when current flows through a conductor, the Faraday effect causes birefringence between left circularly polarized and right circularly polarized lights, resulting in a phase difference between the two lights.

Afterwards, the left and right circular polarizations of the light reflected by the mirror located at the end of the coil are reversed, and the direction of travel of the light wave changes to become opposite to the direction of the magnetic field caused by the current, thereby increasing a phase difference experienced by the two circularly polarized lights by the same amount as during incidence. The light exiting the optical fiber sensor coil is converted into linearly polarized light by the $\lambda/4$ wave plate (QWP) and returned with polarization states in the fast axis and slow axis directions of the polarization-maintaining optical fiber.

The light with the two linearly polarized states reflected in this way is diverged from the first optical splitter to the output unit, and split into two halves at the second optical splitter. Among the split lights, the light traveling along the upper optical fiber is twisted by 90° and passes through the connected polarization-maintaining optical fiber, thereby changing the polarization state. Upon passing through the polarizer connected to the next stage, only the specific polarization component remains among the polarization components reflected from the coil. The light that is split in the second optical splitter and travels along the lower optical fiber passes through a phase modulator, and as it passes through the polarizer, only the same polarization component as the upper specific polarization component remains. Consequently, they meet at the third optical splitter and cause interference, and if there is a phase difference between the two components, the interference causes a change in optical power.

At this time, the phase modulator is used to compensate for the initial phase difference between the two polarization components and to set the operating point at which the output signal response characteristics are maximized. Meanwhile, various current sensors based on polarization-rotated reflection interferometry have been developed that have different methods of receiving and processing optical signals at the PD end (photodetector end).

However, traditional current sensors based on polarization-rotated reflection interferometry face demands for improvement in the following aspects:

In other words, there is a need to secure the reliability of the sensor system by minimizing distortion of the detection signal due to external vibration and temperature changes for polarized light transmitted through optical fiber. There is also a need to secure the stability of the system through an optical system configuration for more effective polarization signal control.

In other words, there is a demand to minimize changes in optical characteristics due to external vibrations or temperature variations, minimize optical losses, and maximize optical transmission efficiency.

Furthermore, recently, there has been a continuous demand for the development of technologies that can effectively measure sensing signals and control sensor operating points by integrating a phase modulator into an integrated optical system.

<Prior Art 1>: Korean Patent Application No. 2017-0141150 (Publication Date: Dec. 22, 2017)

SUMMARY OF THE INVENTION

The present invention is intended to address the above problems, and the objective thereof is to provide an integrated optical system-based optical current sensor system that can minimize signal failure due to external vibration and minimize changes in the optical system due to external temperature changes.

According to one embodiment of the present invention for achieving the above objective, an optical current sensor system comprises a light source for generating a reference light for current or magnetic field sensing, a beam circulator or beam splitter for directing the reference light in a selected direction, a polarizer for polarizing the reference light, a phase modulator for phase-modulating the polarized light into a predetermined reference signal, a polarization converter for converting linearly polarized light into circularly polarized light, and a detector for current or magnetic field sensing, wherein the optical current sensor system further comprises a Faraday rotation reflector that reflects a light propagated along an optical path from the end of an optical fiber, and the polarizer and the beam circulator or the beam splitter are integrated into an integrated optical system composed of a plurality of optical components optically bonded to each other in the integrated optical system-based optical current sensor system.

The integrated optical system-based optical current sensor system further comprises a plurality of pig-tailed optical fiber blocks internally accommodating the optical fibers, and wherein the pig-tailed optical fiber blocks and the optical components are composed of low thermal expansion glass material, and the plurality of blocks, each provided with V-shaped or U-shaped processing grooves for accommodating the optical fibers, are configured to face each other in the integrated optical system-based optical current sensor system.

The integrated optical system-based optical current sensor system includes transmitting the input light of the light source in the selected direction through the beam splitter or the beam circulator, and further comprises a linear polarizer for linearly polarizing the transmitted light from the beam splitter or the beam circulator, and a 45-degree polarizer for directing the linearly polarized light at a 45-degree angle to the optical axis of the polarization-maintaining optical fiber.

In addition, according to the present invention, there is provided an integrated optical system-based optical current sensor system comprising a light source for generating a reference light for current or magnetic field sensing, a beam circulator or beam splitter for directing the reference light in a selected direction, a polarizer for polarizing the reference light, a phase modulator for phase-modulating the polarized light into a predetermined reference signal, a polarization converter for converting linearly polarized light into circularly polarized light, and a detector for current or magnetic field sensing, wherein the beam circulator or beam splitter and the polarizer are configured as an integrated optical system composed of a plurality of optically bonded optical components, and the phase modulator is incorporated within the integrated optical system.

The integrated optical system further comprises a linear polarizer for linearly polarizing the light transmitted from the light source and a 45-degree polarizer for directing the linearly polarized light at a 45-degree angle to the optical axis of a polarization maintaining fiber, wherein the phase modulator is positioned between a polarization beam splitter connected to the beam circulator or beam splitter and a first mirror that reflects the fast polarized light separated from the polarization beam splitter through a linear polarizer to a beam combiner or beam splitter, and the slow polarized light separated from the polarization beam splitter is reflected to the beam combiner or beam splitter at a second mirror through a half-wave plate and a linear polarizer.

According to the present invention, the need for separate alignment processes for optical blocks and optical fibers is eliminated by integrating optical components optically bonded together in the production of a current sensor system based on polarization-rotated reflection interferometry. Additionally, by constructing an integrated optical system, no boundary regions are formed between optical components is avoided, minimizing optical losses that typically occur at boundary regions, and fundamentally preventing distortion (misalignment) caused by external shocks or vibrations, thereby enhancing the measurement reliability of the photodetector.

Moreover, by implementing smooth transmission of light from the light source and sensing optical signals, stable light detection can be achieved by minimizing the optical loss of the output light source, and based on an integrated optical system made of low thermal expansion glass materials, variations in optical characteristics due to temperature changes can be minimized.

Furthermore, by integrating a phase modulator within the integrated optical system to more effectively measure the sensing signal and control the sensor operating point, it is possible to secure system stability against external vibration and temperature changes, minimize product size, and secure price competitiveness.

Moreover, traditionally, the application of a phase modulator required the use of a long length of delay optical fiber and the use of a high-speed phase modulator, whereas according to the present invention, it is possible to configure and integrate an SNRPM (Spatial Non-Reciprocal Phase Modulation) within an integrated optical system, minimizing the application of traditional optical components and reducing product size, and thereby securing price competitiveness.

BRIEF DESCRIPTION OF THE DRAWINGS

FIG. 3 represents the configuration of an integrated optical system-based current sensor system according to the first embodiment of the present invention.

FIG. 4 shows the configuration of an integrated optical system-based current sensor system according to the second embodiment of the present invention.

DETAILED DESCRIPTION OF THE EXEMPLARY EMBODIMENTS

Figure 1:
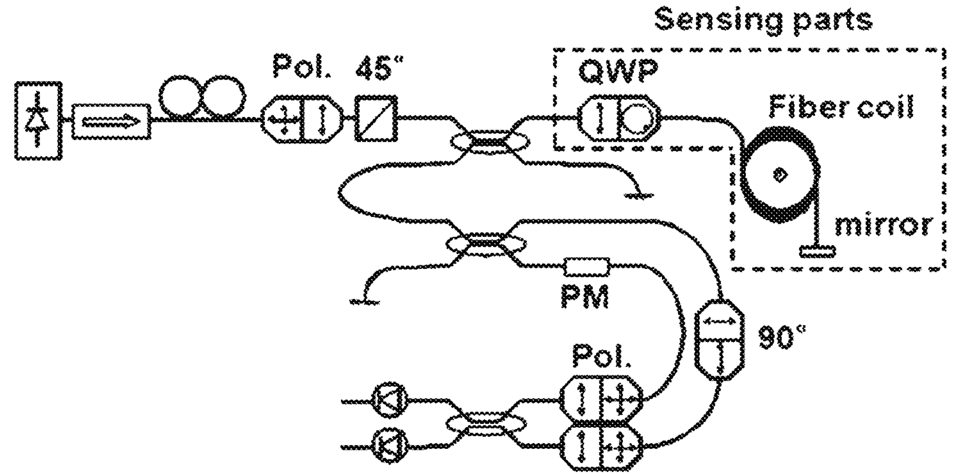
FIG. 1 illustrates a schematic configuration of an optical current sensor system based on polarization-rotated reflection interferometry, composed of a light source, a sensing unit, and a polarization analysis unit.

Below, the present invention is described in more detail with reference to the attached drawings. The attached drawings are provided as examples to sufficiently convey the concept of the present invention to those skilled in the art.

Therefore, the present invention is not limited to the drawings provided below and can be embodied in other forms.

First Embodiment

Figure 3:
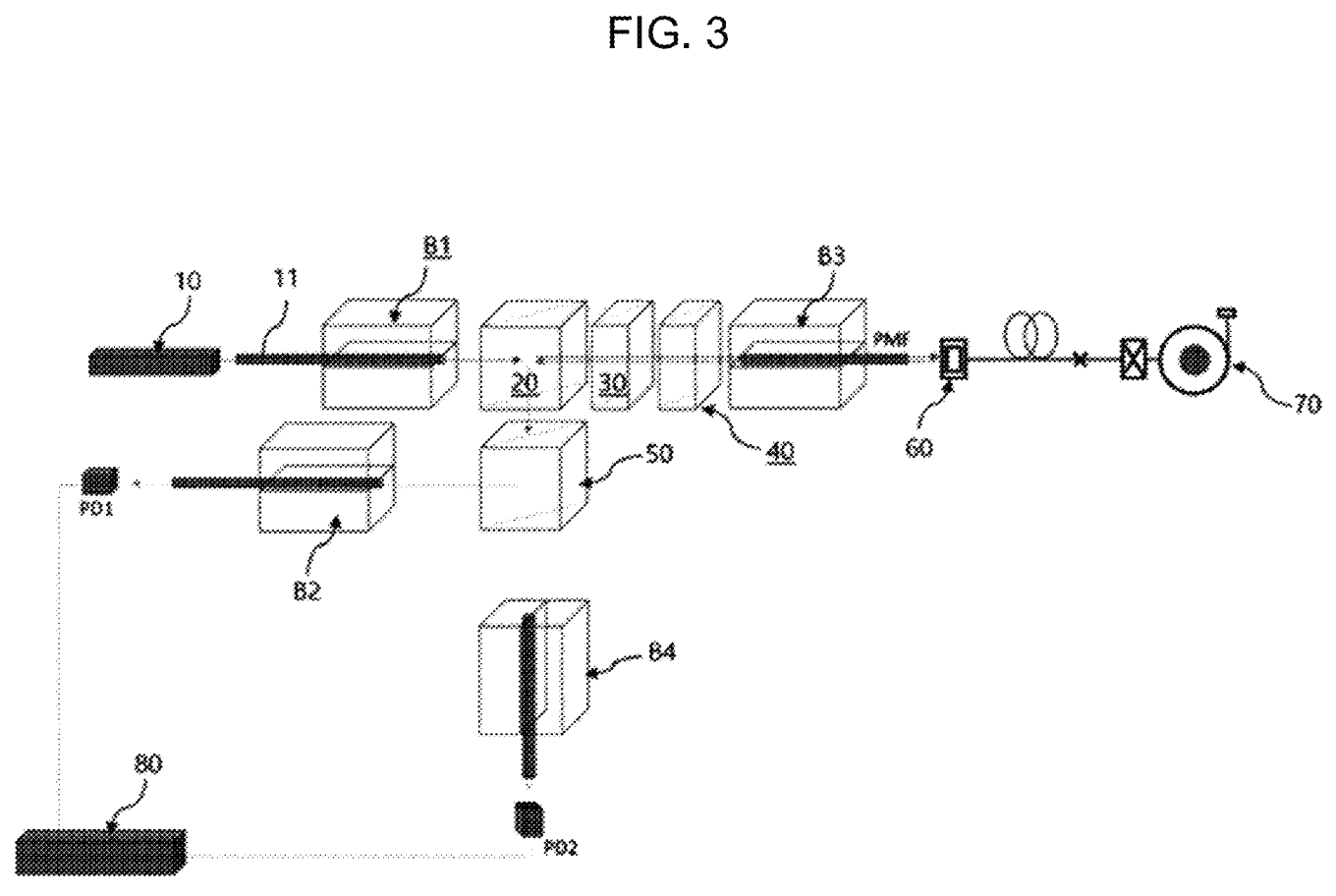

FIG. 3 illustrates a schematic configuration of an integrated optical system-based current sensor system according to the first embodiment of the present invention.

Referring to FIG. 3, the present invention provides a plurality of pig-tailed optical fiber blocks (B1 to B4). Here, the pig-tailed optical fiber blocks (B1 to B4) each form a V-shaped or U-shaped processing groove between a lower block and an upper block made of low thermal expansion glass material, and the optical fiber 11 is provided in a pigtail arrangement within this V-shaped or U-shaped processing groove formed by facing blocks.

Meanwhile, it is also possible to apply optical fibers combined with parallel light control and focusing lenses, or collimator lenses, to replace the plurality of pig-tailed optical fiber blocks (B1~B4) illustrated in FIG. 3

Furthermore, depending on the purpose, the blocks (B2 and B4) at the ends of the photodetectors may be configured to select and use only specific polarization components.

Furthermore, a beam splitter 20, a linear polarizer 30, and a 45-degree polarizer 40 are arranged in series between the pig-tailed optical fiber blocks (B1 and B3) and integrated through optical bonding. In this case, it is also acceptable to directly rotate the polarization axis of the polarization-maintaining optical fiber in block (B3) by 45 degrees instead of using the 45-degree polarizer 40. In the state in which a polarization beam splitter 50 is disposed at the bottom of the beam splitter 20, and pig-tailed optical fiber blocks B2 and B4 are disposed on the left and bottom sides of the polarization beam splitter 50, respectively, these components are optically bonded and integrated. In addition, photodetectors (PD1, PD2) for signal analysis are also connected. Each of these optical components can exhibit resistance to external temperature changes and minimize temperature dependency by using low thermal expansion glass material.

Meanwhile, for optical bonding, one surface of each optical component constituting the integrated optical system is formed to have almost the same surface morphology, and surface roughness and surface quality performance are improved through polishing, and foreign substances are removed through cleaning.

This optical bonding is a bonding caused by intermolecular attraction (Van der Waal's Force) and has the effect of eliminating the bonding boundary region. Therefore, optical signals passing through the optical components can be stably transmitted without damage or loss at the boundary region.

This optical bonding method, known as a common bonding technique, involves finishing the materials intended for bonding with nearly the same curvature, cleaning the surfaces, and then pressing them together either as they are or with the addition of water or benzene. The bonding strength at the surface increases gradually over time after attachment, and there is almost no angular error due to bonding. Additionally, there is a characteristic of no distortion occurring after bonding.

In addition, the present invention is based on a low thermal expansion glass material so that optical signals can be stably transmitted and detected without loss between optical components, and it is preferable to use materials with the same refractive index.

The integration of these optical components involves processing the respective optical blocks to be applied to have perpendicularity, allowing them to be optically bonded to each other without the need for separate adhesive between the processed surfaces, creating the effect of eliminating the boundary interface, and minimizing optical losses occurring at the boundary interface.

Additionally, optical loss in the output light sources can be minimized through smooth transmission of the reference light source and sensing optical signal source. Additionally, the necessity of the alignment process for coupling between optical fibers and bulk optical components can be eliminated through direct bonding and integration. This not only obviates the existing alignment process but also maximizes optical transmission efficiency.

Moreover, conventional mechanical methods or adhesive-based coupling methods of bulk optical components involve mechanically fixing or adhering to the optical components by adhesive in an optimally aligned state after performing optical alignment between the machined surfaces. In contrast, the present invention achieves mutual bonding using an optical bonding method without the need for separate adhesive between the machined surfaces. This approach minimizes the influence of external impacts or vibrations causing misalignment, as well as reducing optical losses and noise due to changes in temperature or humidity.

Furthermore, the integrated optical system-based current sensor according to the first embodiment of the present invention is based on the principle of measuring the polarization change of light transmitted in the optical fiber through the circular birefringence variation of the optical fiber, which occurs proportional to the intensity of the magnetic field induced by the applied current, when light is transmitted in the optical fiber wound in the same direction as the direction of the magnetic field generated by the flow of the current.

The optical fiber current sensor based on polarization-rotated reflection interferometry, with this principle includes directing an input light from a light source 10 in a selected direction through a beam splitter 20 (or a beam circulator); then converting the light into a linearly polarized light by passing through a linear polarizer 30; then rotating the polarized light by a 45-degree angle relative to the optical axis of the polarization-maintaining optical fiber (PMF) using a 45-degree polarizer 40, thereby to compensate for the initial phase difference, ensuring that the light traveling along the fast and slow axes of the PMF maintains the same magnitude; then in order to adjust the operating point to maximize the output signal response characteristics, passing the light through a phase modulator 60 and transmitting same through the PMF for delay purposes; and finally converting the light into left-circularly polarized light and right-circularly polarized light by a $\lambda/4$ wave plate (quarter-wave plate: QWP) connected to the front end of the sensor probe 70, continuing along the fiber optic sensor probe 70.

Here, the phase modulator 60 must have the capability to differently modulate the phases of the light incident on the optical fiber from the light source 10 and the light reflected and returned. For this purpose, a long length of optical fiber delay line is essential, and high-speed phase modulators are commonly used.

This type of phase modulation method is referred to as Non-Reciprocal Phase Modulation (NRPM), and since a high-speed phase modulator is essential, an expensive lithium niobate ($LiNbO3$) electro-optic phase modulator or a high-speed piezo-electric phase modulator is used.

In addition, additional delay optical fibers are essential to secure the time delay for modulation for the generation of the bias phase and the sensing processed phase, which depend on the transmission time of the optical fiber. Therefore, linear birefringence inevitably exists in these delay optical fibers due to internal and external stress disorders, which hinders the stability of the system and increases the product size, causing an increase in unit cost.

Meanwhile, if the length of the delay optical fiber does not match the cycle frequency of the modulator, it can cause disturbances in the phase shift at the output stage of the phase modulator, thereby impairing the accuracy of the system. Additionally, during signal detection, the sampling frequency will affect the transmission time, and short transmission times require high sampling frequencies, which increase the noise bandwidth of the system and make it more vulnerable to interference, thereby degrading sensing characteristics.

To overcome these drawbacks, the invention proposes a spatial non-reciprocal phase modulation (SNRPM). This method is implemented through the refractive index ellipsoid theory based on electro-optical crystals, and directly performs a phase delay between the interfering lights through a modulation voltage in a way that adjusts the phase of light simultaneously in different axial directions.

This avoids the inherent frequency limitation for the modulation frequency and allows more freedom in setting the modulation sensitivity and dynamic operating range. Therefore, the phase error can be minimized and the accuracy of the system can be improved by eliminating the need for a delay optical fiber.

When a current flow through the wire, the optical signal that passes through the λ/4 wave plate (QWP) and enters the sensor probe 70 causes birefringence between left-circularly polarized light and right-handed circularly polarized light due to the Faraday effect due to the magnetic field, resulting in a phase difference between the two lights. In addition, the light reflected by the mirror (Faraday rotating reflector; FRM) located at the end of the optical fiber sensor probe 70 undergoes a reversal of the left-circularly polarized light and right-circularly polarized light, and the direction of propagation of the light wave changes, resulting in a reverse direction with respect to the magnetic field induced by the current. As a result, the phase difference experienced by the two circularly polarized lights increases by the same amount as when they are incident, to be multiplied, thereby enhancing precision.

The sensing signal in which the polarization change occurred, that is, the light coming out of the optical fiber sensor probe 70, is converted into each of the linearly polarized lights by the λ/4 wave plate (QWP), maintaining the polarization states of the fast and slow axes of the polarization-maintaining optical fiber. The two linearly polarized lights reflected and returned in this way have a phase difference depending on the current value, and the power value of the optical signal is proportional (Faraday effect).

Meanwhile, the returned linearly polarized component undergoes rotation at the 45-degree fusion point and passes through the linear polarizer 30, where the two orthogonal linearly polarized components are combined and filtered as a component of the linear polarizer 30. Subsequently, after passing through the beam splitter 20 or beam circulator, the applied current value is determined by measuring the optical power by a photodetector (PD1 or PD2), Alternatively, the light is divided into P-polarized and S-polarized lights by the polarization beam splitter 50, and changes in the applied current can be monitored by measuring the optical power value of each component.

Second Embodiment

Figure 4:
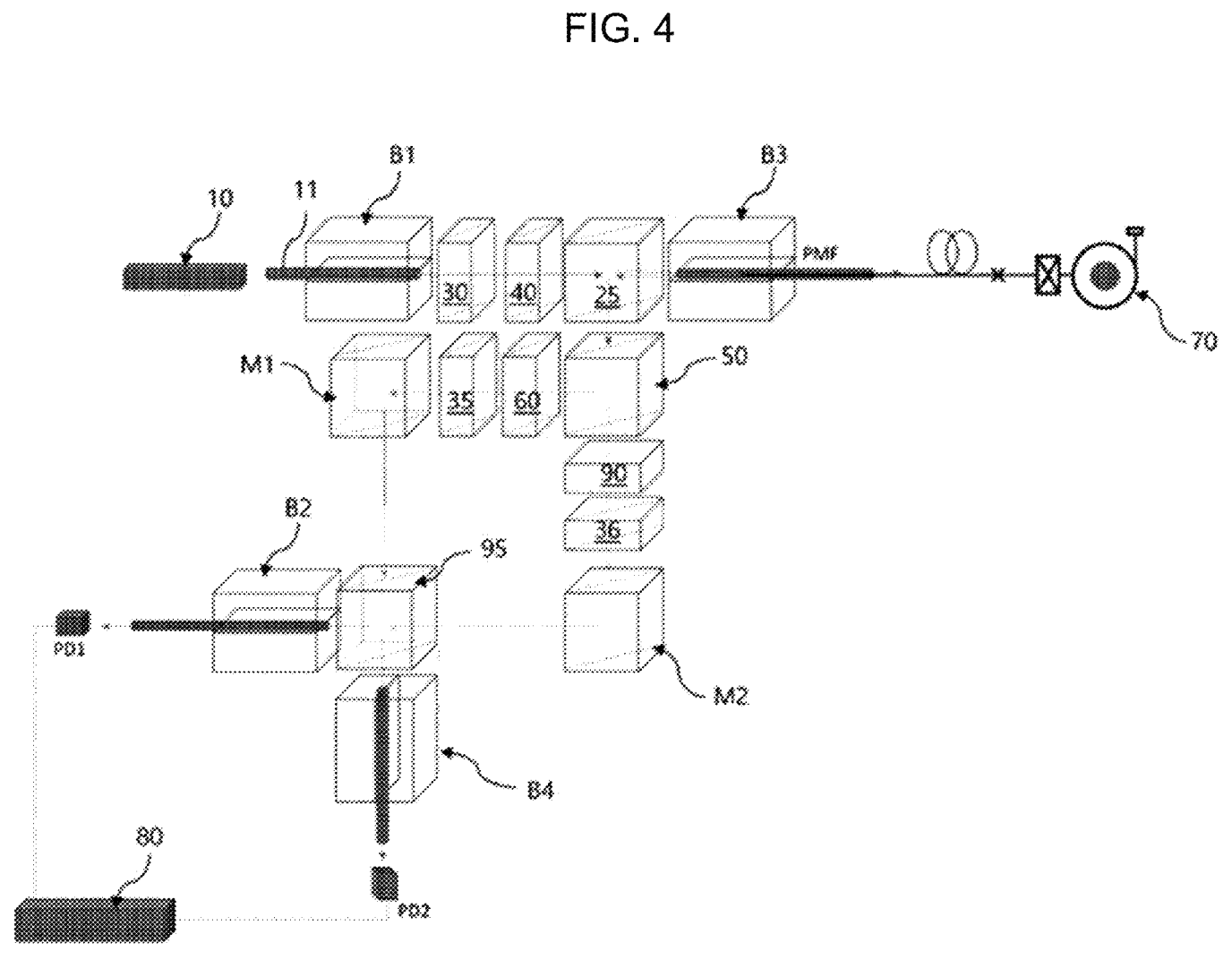

FIG. 4 is a configuration diagram of an integrated optical system-based current sensor according to the second embodiment of the present invention.

The present embodiment differs structurally from the first embodiment in the optical circuit of the current sensor. Specifically, the present embodiment integrates a phase modulator within the integrated optical system to effectively measure sensing signals and control the operating point of the sensor, while maintaining the same approach of constructing an integrated optical system through optical bonding to minimize disturbances caused by external vibrations and temperature changes for ensuring reliability.

Firstly, a light source 10 is connected through fusion with a pig-tailed optical fiber block (B1), and the light transmitted through the pig-tailed optical fiber block passes through a linear polarizer 30 and a 45-degree polarization rotator 40. Then, the light passes through a beam circulator 25 (or beam splitter) and then passes a quarter-wave plate (QWP) located at the end of the optical fiber coil, via a polarization-maintaining fiber (PMF) leading to a sensor probe 70.

Here, instead of using the phase modulator 60 previously applied at the front end of the polarization-maintaining fiber (PMF), the integrated optical system incorporates a phase modulator 60 to ensure system stability against external vibrations and temperature changes, minimize product size, and maintain price competitiveness for the fiber optic current sensor system. In other words, the phase modulator 60 can be positioned between the polarization beam splitter 50 and the linear polarizer 35 and then integrated using optical bonding.

The linearly polarized component, rotated at a 45-degree angle before entering the polarization-maintaining fiber (PMF), is separated into fast and slow axes while passing through the PMF. The two separated polarized lights compensate for the initial phase difference to ensure that both polarized lights have the same magnitude. The adjustment of the operating point, where the output signal response characteristics are maximized, is controlled by the phase modulator 60 included in the integrated optical system.

Here, the two polarized lights pass through the λ/4 wave plate (QWP) to have polarization characteristics of +45° and −45° through a 45° rotation fusion at the front end of the λ/4 wave plate (QWP), and are then converted into left-circularly polarized light and right-circularly polarized light and transmitted to an optical fiber sensor probe 70.

The optical signals transmitted through the optical fiber sensor probe 70 undergo birefringence between left-circularly polarized and right-circularly polarized light due to the Faraday effect described above, resulting in a phase difference between the two lights. The rotated signals that have been circularly polarized through sensing emerge from the optical fiber sensor probe 70, are then converted back into respective linearly polarized lights by the λ/4 wave plate (QWP), and return while maintaining the polarization states of the fast axis and slow axis of the polarization-maintaining fiber (PMF). The returned linearly polarized components, with both slow and fast axis polarizations, rotate at the 45° fusion point and are then connected to a polarization beam splitter 50 via a beam circulator 25. At the polarization beam splitter, respective polarization components are separated. The fast-axis polarized light passes through the phase modulator 60 and then through a linear polarizer 35 and is reflected by a mirror (M1), and then enters respective optical detectors (PD1, PD2) via a beam combiner 95 (or beam splitter).

Furthermore, the remaining slow-axis polarized light is rotated by 90 degrees via a half-wave plate 90, passes through a linear polarizer 36, a mirror M2, and a beam combiner 95, and enters respective photodetectors (PD1, PD2). The interferometer formed at the beam combiner 95 is used to measure changes in optical power.

In this way, an integrated optical system-based optical current sensor system based on polarization-rotated reflection interferometry requires various optical components such as fiber optic splitters, fiber optic polarizers, phase modulators, and optical fiber phase retarders, which are typical components of the existing optical fiber-based optical system. This can lead to drawbacks such as increased sensor cost and limitations on application range. Additionally, the application of a phase modulator raises problems such as the need for a long length of delay optical fiber and the use of high-speed phase modulators.

Meanwhile, if SNRPM (Spatial non-reciprocal phase modulation) is configured and integrated within an integrated optical system as in the present invention, the utilization of conventional optical components can be minimized, leading to a reduction in product size and ensuring competitive pricing.

Figure 2:
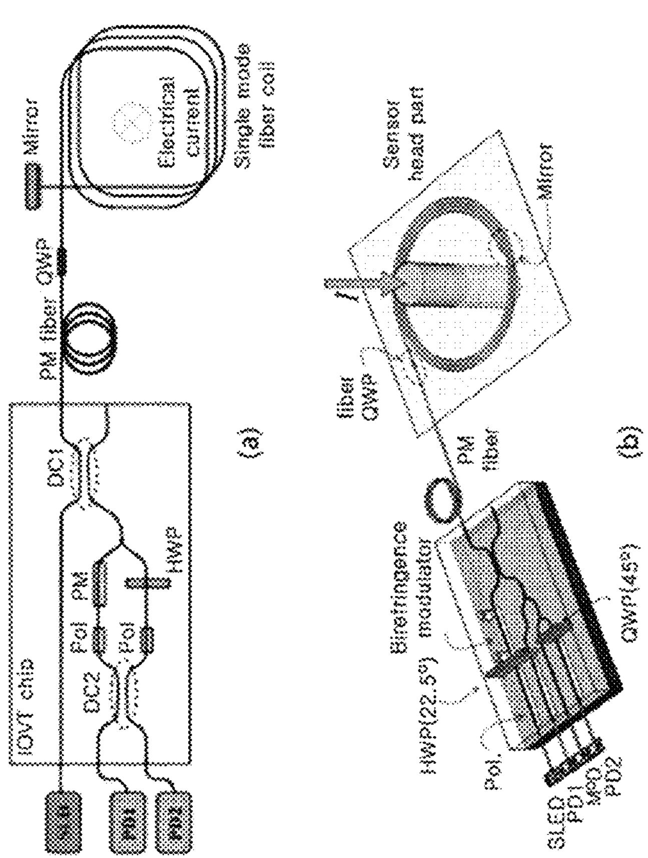
FIG. 2 illustrates the configuration of an optical current sensor system based on polarization-rotated reflection interferometry based on a photonic integrated circuit (PIC).

Moreover, unlike polymer waveguide components of a photonic integrated circuit-based optical current sensor system based on polarization-rotated reflection interferometry illustrated in FIG. 2, the present invention constructs an integrated optical system based on low-thermal-expansion glass through optical bonding. This ensures system stability against external vibrations and temperature variations, significantly improving the reliability and accuracy of the sensor system.

In addition, by eliminating the delay optical fiber, linear birefringence induced by internal and external stress disorders in the optical fiber can be fundamentally minimized, thereby ensuring system reliability.

The above describes and illustrates the invention with reference to specific embodiments. However, the invention is not limited to the embodiments described above. Those skilled in the art to which the invention pertains will recognize various modifications that can be made within the scope of the technical concept of the invention as set forth in the following claims.

The invention claimed is:

1. An integrated optical system-based optical current sensor system comprising a light source for generating a reference light for current or magnetic field sensing, a beam circulator or beam splitter for directing the reference light in a selected direction, a polarizer for polarizing the reference light, a phase modulator for phase-modulating the polarized light into a predetermined reference signal, a polarization converter for converting linearly polarized light into circularly polarized light, a detector for current or magnetic field sensing, and a Faraday rotation reflector for reflecting a light propagated along an optical path at an end of an optical fiber, wherein the beam circulator or the beam splitter and the polarizer are configured as an integrated optical system composed of a plurality of optical components optically bonded to each other in the integrated optical system-based optical current sensor system, wherein the integrated optical system includes transmitting an input light of the light source in the selected direction through the beam splitter or the beam circulator, and further comprises a linear polarizer for linearly polarizing the transmitted light from the beam splitter or the beam circulator, and a 45-degree polarizer for directing the linearly polarized light at a 45-degree angle to an optical axis of a polarization-maintaining optical fiber.

2. The integrated optical system-based optical current sensor system of claim 1, wherein the integrated optical system further comprises a plurality of pig-tailed optical fiber blocks internally accommodating the optical fibers, and wherein the pig-tailed optical fiber blocks and the optical components are composed of low thermal expansion glass material, and the plurality of blocks, each provided with V-shaped or U-shaped processing grooves for accommodating the optical fibers, are configured to face each other in the integrated optical system-based optical current sensor system.

3. An integrated optical system-based optical current sensor system comprising a light source for generating a reference light for current or magnetic field sensing, a beam circulator or beam splitter for directing the reference light in a selected direction, a polarizer for polarizing the reference light, a phase modulator for phase-modulating the polarized light into a predetermined reference signal, a polarization converter for converting linearly polarized light into circularly polarized light, and a detector for current or magnetic field sensing, wherein the beam circulator or beam splitter and the polarizer are configured as an integrated optical system composed of a plurality of optically bonded optical components, and the phase modulator is incorporated within the integrated optical system, wherein the integrated optical system further comprises a linear polarizer for linearly polarizing the light transmitted from the light source and a 45-degree polarizer for directing the linearly polarized light at a 45-degree angle to the optical axis of a polarization maintaining fiber, wherein the phase modulator is positioned between a polarization beam splitter connected to the beam circulator or beam splitter and a first mirror that reflects the fast polarized light separated from the polarization beam splitter through a linear polarizer to a beam combiner or beam splitter, and the slow polarized light separated from the polarization beam splitter is reflected to the beam combiner or beam splitter at a second mirror through a half-wave plate and a linear polarizer.

* * * * *